(12) United States Patent
Sluggett et al.

(10) Patent No.: US 12,485,222 B2
(45) Date of Patent: Dec. 2, 2025

(54) SENSOR ARRAY (71) Applicant: Infusion Innovations Pty Ltd, Findon (AU)

(72) Inventors: Andrew Sluggett, Rostrevor (AU); Danny Djurasevich, Unley Park (AU); Julian Banfield, Seaholme (AU)

(73) Assignee: Infusion Innovations Pts Ltd., Findon (AU)

( * ) Notice: Subject to any disclaimer, the term of this patent is extended or adjusted under 35 U.S.C. 154(b) by 974 days.

(21) Appl. No.: 17/604,111

(22) PCT Filed: Apr. 16, 2020

(86) PCT No.: PCT/AU2020/050380
§ 371 (c)(1),
(2) Date: Oct. 15, 2021

(87) PCT Pub. No.: WO2020/210874
PCT Pub. Date: Oct. 22, 2020

(65) Prior Publication Data
US 2022/0203027 A1 Jun. 30, 2022

(30) Foreign Application Priority Data
Apr. 16, 2019 (AU) .................. 2019901314

(51) Int. Cl.
*A61M 5/168* (2006.01)
*H05K 1/02* (2006.01)
*H05K 1/18* (2006.01)

(52) U.S. Cl.
CPC ....... *A61M 5/16854* (2013.01); *H05K 1/0272* (2013.01); *H05K 1/18* (2013.01);
(Continued)

(58) Field of Classification Search
CPC .... A61M 5/16854; A61M 2005/16868; A61M 2005/16872; A61M 2205/332;
(Continued)

(56) References Cited

U.S. PATENT DOCUMENTS

| 4,209,185 A | 6/1980 | St Clair et al. |
| 8,065,924 B2 | 11/2011 | Ziegler et al. |

(Continued)

FOREIGN PATENT DOCUMENTS

| CN | 103260671 A | 8/2013 |
| CN | 107847663 A | 3/2018 |

(Continued)

OTHER PUBLICATIONS

Written Opinion for Singaporean Patent Application 11202111364V, mailed on Sep. 11, 2024, 9 pages.

(Continued)

*Primary Examiner* — Dung T Ulsh
*Assistant Examiner* — Nelson Louis Alvarado, Jr.
(74) *Attorney, Agent, or Firm* — Fresh IP PLC; Clifford D. Hyra; Aubrey Y. Chen (57) ABSTRACT

The present invention relates to a sensing device, a method of use of a sensing device and a method of manufacture of a sensing device. Embodiments are generally configured as sensor arrays for detecting a pressure change within an infusion line to pre-empt or detect line occlusions in the administration of medical infusions. Generally, embodiments comprise a support component having a support surface for mounting thereon one or more electrically connected switches, a length of expandable tubing for passing a fluid therethrough and are secured to the support surface and in physical contact with the electrically connected switches. The one or more electrically connected switches forms a sensor array adapted to sense expansion of the (Continued)

expandable tubing indicative of pressure changes resulting from line occlusions.

11 Claims, 6 Drawing Sheets

(52) U.S. Cl.
CPC ............. *A61M 2005/16868* (2013.01); *A61M 2005/16872* (2013.01); *A61M 2205/332* (2013.01); *A61M 2207/00* (2013.01); *H05K 2201/09027* (2013.01); *H05K 2201/10053* (2013.01); *H05K 2201/10151* (2013.01)

(58) Field of Classification Search
CPC .......... A61M 2207/00; A61M 5/14232; A61M 2205/18; A61M 5/142; A61M 2205/0216; A61M 2205/3331; A61M 5/1418; A61M 5/158; A61M 2005/1588; A61M 2205/3362; A61M 2205/502; H05K 1/0272; H05K 1/18; H05K 2201/09027; H05K 2201/10053; H05K 2201/10151; H05K 2201/09063; H05K 2201/1009; H05K 3/301; H01H 2207/026; H01H 2207/032; G01L 9/00; G01L 15/00; G01L 13/00; G01L 13/06; G01L 13/04; G01L 13/02; G01L 13/021; G01L 9/0026; G01L 9/0041

See application file for complete search history.

(56) References Cited

U.S. PATENT DOCUMENTS

| 8,733,178 | B2 | 5/2014 | Bivans et al. |
| 2012/0079886 | A1 | 4/2012 | Beck et al. |
| 2012/0203179 | A1 | 8/2012 | Hills et al. |
| 2013/0238261 | A1* | 9/2013 | Denis ................ A61M 5/16854 702/50 |
| 2015/0209511 | A1 | 7/2015 | Momose |
| 2021/0379281 | A1* | 12/2021 | Pizzochero ....... A61M 5/16854 |

FOREIGN PATENT DOCUMENTS

| RU | 2617708 | C1 | 4/2017 | |
| WO | 9707843 | A1 | 3/1997 | |
| WO | 03074121 | A1 | 9/2003 | |
| WO | 2007141786 | A1 | 12/2007 | |
| WO | WO-2016090265 | A1 * | 6/2016 | ........ A61M 5/14248 |
| WO | 2017018974 | A1 | 2/2017 | |
| WO | 2017079174 | A1 | 5/2017 | |
| WO | 2017118535 | A1 | 7/2017 | |

OTHER PUBLICATIONS

Office Action for Indonesian Patent Application P00202109439, mailed on Nov. 5, 2024, 3 pages.
Search Report for the European Patent Application EP 20 79 2149, mailed on Dec. 12, 2022, 13 pages.
First Office Action for the Chinese Patent Application 202080037630.X, mailed on Dec. 29, 2023, 3 pages.
Second Office Action for the Chinese Patent Application 202080037630.X, mailed on Sep. 21, 2024, 7 pages.
Requisition for the Canadian Patent Application 3,137,044, mailed on Mar. 18, 2024, 5 pages.
Examination Report for Australian Patent Application 2020257791, mailed on Oct. 30, 2024, 4 pages.

* cited by examiner

SENSOR ARRAY

PRIORITIES AND CROSS REFERENCES

This Application claims priority from International Application No. PCT/AU2020/050380 filed on 16 Apr. 2020, and Australian Patent Application No. 2019901314 filed on 16 Apr. 2019 the teachings of each of which are incorporated by reference herein in their entirety.

TECHNICAL FIELD

The present invention relates to a sensing device for a one-time use medical device, a method of using a sensing device and a method of manufacture of a sensing device. Embodiments are generally configured as sensor arrays for detecting a pressure change within a length of expandable tubing, such as an infusion line, to pre-empt or detect line occlusions during the administration of fluids during fluid processes such as medical infusions. Sensor arrays are generally adapted to sense expansion of an expandable tubing indicative of pressure changes resulting from line occlusions.

BACKGROUND

Medical infusion devices are used to introduce medicinal fluids into a patient's circulatory system. Infusion devices deliver medicinal fluids from an infusion bag into a patient's venous system through a patient's administration set; typically including an infusion line connected to the patient via a vascular access device such as a catheter or a needle. Medical infusion devices are used to draw the fluid from the infusion bag through the patient's administration set and to the patient.

Operational failures that arise during the use of infusion pumps are frequently caused from occlusions in the infusion line. Such errors present such significant health risks that can result in the death of the patient. To prevent such failures, regulators require that medical infusion devices include mechanisms to detect and signal occlusion events. However, the occlusion sensors that have been developed to date and have been adopted in commercially available infusion devices have several shortcomings.

An occlusion is an obstruction in the flow of an infused medicinal fluid due to a blockage in the infusion line. Occlusions typically arise if some physical impediment to the infusion line occurs, for instance if a patient unintentionally compresses the infusion line, or if a chemical change occurs to the medicinal fluid. For instance, larger molecules such as proteins may be sensitive to physical changes such as changes in pH or temperature, which may at times fluctuate causing protein aggregates to form, in turn, occluding the infusion line.

Occlusion can either occur upstream or downstream of the infusion pump. An upstream occlusion occurs in the infusion line connected between the infusion bag and the pump. Upstream occlusions typically arise from mechanical failures in the use of the line, for instance when a medical practitioner fails to release the clamp after activating the infusion pump or when the infusion line is kinked, for instance if the line becomes caught under the patient or under the patient's bed. When an upstream occlusion occurs, the upstream pressure is reduced, and a vacuum is generated in the infusion line thereby causing the line to contract. The contraction in the infusion line impedes the flow of medicinal fluid to the patient.

A downstream occlusion occurs in the section of the line connected between the pump and the patient. A downstream occlusion is typically caused by a build-up of fluid within the infusion line, which is suddenly released causing a bolus of fluid to move through the infusion line to the patient. The continued operation of the infusion pump in the event of an obstruction within the line increases the pressure of the fluid within the infusion line. The increase in pressure causes the infusion line to expand or bulge. An increased dose of medicinal fluid is typically released and delivered to the patient as a bolus once the downstream occlusion is released, either through the force applied from the pressure build-up or other means of dislodgement.

Commercially available smart infusion pumps attempt to detect occlusions by way of a pre-set occlusion pressure threshold. Such smart infusion pumps can detect occlusions once the pressure within infusion line connected to the patient exceeds the pre-set limit; the higher the pre-set limit, the longer it takes for an occlusion to be detected. To detect downstream occlusions in the infusion line, the pressure in the infusion line must exceed the pre-set limit. By the time the downstream occlusion is detected, a large bolus is already formed within the infusion line. Also, the pump's pre-set limit is always higher than the upstream occlusion pressure. As an upstream occlusion causes a vacuum or drop in the infusion line pressure, therefore the upstream occlusion will typically remain undetected. As a result, smart infusion pumps typically fail to detect upstream occlusions and can only detect downstream occlusions arising from significant pressure increases in the infusion line.

To overcome the problems that continue to occur in the smart sensing of occlusions, engineers have deployed various types of sensors to sense a restriction in the flow of fluid through a patient's infusion line. Sensing systems that have attempted to overcome these problems include complex apparatus such as opto-electronic drop sensors, pressure sensors, force sensors and so on.

Opto-electric drop sensors, when combined with a drip chamber, have been used to detect upstream occlusions in infusion systems that use peristaltic pumps. The drop sensor automatically detects upstream occlusions, such as occlusions caused by a clamp or kink in the upstream line, by detecting an absence of drops. However, movement of the IV administration set, if severe enough, can cause extra drops to fall from the drip chamber or can interrupt drops, causing false counts and false alarms. Ambient light can also interfere with an optical drop sensor and cause sensor inaccuracies.

Another method for detecting occlusions is to incorporate a pressure sensor into the pumping mechanism of the infusion pump itself. In one example, a pressure transducer is placed in the middle of the pumping area, allowing direct measurement of the pressure in the infusion line segment, which is indicative of the line pressure. However, this can adversely affect flow uniformity and may require substantial modification to the pumping mechanism.

Pressure sensors are typically provided at the proximal (upstream side) and distal (downstream side) ends of an infusion pump for determining when the flow of fluid upstream and downstream of the infusion line is occluded. When the measured pressure indicates that the flow of fluid is impeded, an alarm is activated that notifies medical personnel of the occluded condition. Alternatively, pressure sensors can be provided inside the pump to monitor and measure the pressure of fluid within the line. Pressure sensors are also available as board mounted sensors, wherein the sensors are typically mounted on a printed circuit board.

Alternatively, force sensors are available to measure force from the build-up of fluid within the infusion line. Force sensors are provided on the outside of the pump near the line that runs between the pump and patient. An occlusion causes the line to expand thereby exerting force on the force sensor. The sensor can trigger an alarm to alert the user if an expansion of the infusion line is detected. These sensors are only capable of triggering at one pressure change, and typically for downstream occlusions only. They can therefore only sense pressure building up and pressure must rise significantly, beyond a pre-determined threshold, before the sensor is triggered.

Many pressure measuring systems, particularly those that have been developed for smart infusion pumps or smart medical devices, must be placed in contact with the fluid path to detected pressure changes within the infusion line. For medical infusions, these sensors must be placed within the line in contact with the medicinal fluid to sense pressure changes. However, the placement of componentry within the medicinal fluid path compromises the fluid path. Regulatory and health issues arise once a foreign component is placed in contact with the medicinal fluid; for instance, the biocompatibility of materials used in the construction of the component must be determined, and the sterilisation of fluid must be maintained.

Traditional occlusion sensors can only operate upstream or downstream, but not both, as they do not provide sufficient sensitivity and can only detect a single pressure change. They are generally arranged to detect a pressure change that exceeds a pre-set threshold pressure value to activate an occlusion alarm. Consequently, occlusions occurring at pressure values lower than the threshold amount remain undetected. These sensors also remain incapable of pre-empting possible occlusions as they are incapable of detecting more than one pressure and are simply not sensitive enough to detect the small pressure changes that indicate the likelihood of an imminent occlusion.

Occlusion sensors tend to be complex and therefore tend to be prone to failure. Such complex sensors are expensive and therefore are typically inaccessible to many patients.

In addition, the increasing complexity of medical treatments and the development of highly sensitive medicines, for example complex proteins or immunoglobins, that also frequently require a complex administration regime, has created a need for greater precision in the administration of medicines and, in turn, a need for greater precision in the detection of errors. Sensing apparatus are therefore required that are less complex, more cost-effective and are sensitive enough to detect smaller increases or decreases in pressure.

Furthermore, existing occlusion sensors are not adapted for inclusion within one-time use medical devices. Sensors for inclusion in disposable one-time use devices must be simple in construction to maintain a low cost of manufacture without sacrificing sensitivity of detection. They must have a low environmental impact to meet consumer acceptance and regulatory requirements for electronic waste, preferably reducing or eliminating altogether the use of heavy metals and other environmentally recalcitrant materials typically used in complex optical sensors or sophisticated electronics, or by simply being predominantly constructed of recyclable materials.

Various further aspects and features of the disclosure are described below.

SUMMARY OF INVENTION

In a first broad aspect, embodiments of the invention relate to a sensing device for a one-time use medical device comprising; a support component having a support surface for mounting thereon one or more electrically connected switches configured to actuate at a first pre-configured pressure and at a second pre-configured pressure, and a length of expandable tubing for passing a fluid therethrough, secured to the support surface and in physical contact with the electrically connected switches by a securing means, wherein the one or more electrically connected switches forms a sensor array adapted to sense expansion of the expandable tubing.

Sensing devices according to embodiments of the invention may comprise one or more electrically connected switches that comprise one or more pressure switches having two or more pressure actuation thresholds configured to actuate at a first pre-configured pressure and at a second pre-configured pressure, and the first and second pre-configured pressures of the sensor array are capable of providing a stepped output at the two or more pressure actuation thresholds upon expansion of the expandable tubing.

Sensing devices according to embodiments of the invention may comprise a pressure switch having two or more pressure actuation thresholds configured to actuate at a first pre-configured pressure and at a second pre-configured pressure.

Sensing devices according to embodiments of the invention may comprise a first pressure switch, a second pressure switch, and a pressure concentrator positioned between the second pressure switch and a portion of the length of expandable tubing, the pressure concentrator having an upper surface in physical contact with the portion of the length of expandable tubing, and a lower surface in physical contact with the second pressure switch, the pressure concentrator being shaped to concentrate pressure from expansion of the expandable tubing to the second pressure switch, wherein the concentrator is configured to modulate the pressure actuation threshold of the second pressure switch to the second pre-configured pressure.

Sensing devices according to embodiments of the invention may comprise a pressure concentrator holder configured to maintain the placement of the pressure concentrator in physical contact with the second pressure switch or the portion of the length of expandable tubing.

Sensing devices according to embodiments of the invention may comprise a first pressure switch, a second pressure switch wherein either one of the first pressure switch or the second pressure switch has two or more pressure actuation thresholds and is configured to actuate at a third pre-configured pressure.

Preferably, a pressure switch may have a third pressure actuation threshold and may be configured to actuate at a fourth pre-configured pressure. A pressure switch may further include any number of pressure actuation thresholds configured at actuate at a pre-configured pressure.

Preferably, a sensor array may comprise any number of electrically connected switches having any number of pressure actuation thresholds configured at actuate at a pre-configured pressure.

Sensing devices according to embodiments of the invention may comprise at least one additional electrically connected switch having a pressure deactuation threshold, and which is configured to deactuate at an additional pre-configured pressure upon contraction of the expandable tubing.

Sensing devices according to embodiments of the invention may comprise a pressure concentrator holder wherein the support component comprises a printed circuit board, the support surface is provided by a surface of the printed circuit board, and the pressure concentrator holder is formed integrally with the printed circuit board.

Sensing devices according to embodiments of the invention may comprise a securing means which further comprises a tube housing defining a cavity for placing at least a section of the length of expandable tubing therein, and a fastener or bonding agent for securing the tube housing to the support surface to maintain the placement of a portion of the length of expandable tubing in physical contact with the one or more electrically connected switches.

Sensing devices according to embodiments of the invention may comprise a securing means wherein the tube housing comprises; a wall having an external surface and an internal surface, the wall extending longitudinally wherein the internal surface of the wall defines a longitudinal cavity for placing at least a section of the length of expandable tubing lengthwise therein, the wall terminating at opposing ends of the longitudinal cavity in an opening configured to allow the expandable tubing to pass therethrough, the wall having at least one protrusion along the length of two opposing lengthwise edges of the wall, wherein a portion of the internal surface of the wall at the protrusions is in contact with the support surface and is secured thereto.

In a second broad aspect, embodiments of the invention relate to a method for detecting a pressure change within a medical infusion line of a one-time use medical device comprising the steps of; obtaining a sensing device according to the first aspect, connecting the medical infusion line with the length of expandable tubing, passing a fluid through the medical infusion line and the length of expandable tubing, changing the pressure of the fluid within the medical infusion line, expanding or contracting the expandable tubing, applying pressure to an electrically connected switch by the expandable tubing, applying sufficient pressure to reach a pressure actuation or a deactuation threshold, actuating or deactuating at a pre-configured pressure, and outputting actuation or deactuation at the pressure actuation or deactuation threshold.

Methods for detecting a pressure change within a medical infusion line of a one-time use medical device according to embodiments of the invention may comprise the additional steps of; applying sufficient pressure to reach a further pressure actuation threshold, actuating at a further pre-configured pressure, and outputting a further actuation at the further pressure actuation threshold to provide a stepped output.

Methods for detecting a pressure change within a medical infusion line of a one-time use medical device according to embodiments of the invention may comprise the additional step of; pre-empting an occlusion in the medical infusion line.

In a third broad aspect, embodiments of the invention relate to a method of manufacturing a sensing device according to the first aspect comprising the steps of; obtaining a support component having one or more electrically connected switches mounted thereon, a length of expandable tubing, and a securing means, maintaining the length of expandable tubing in physical contact with the one or more electrically connected switches, and securing the length of expandable tubing to the support component by securing the securing means to the support surface.

Sensing devices according to embodiments of the invention may comprise one or more pressure concentrators in contact with the one or more electrically connected switches and may concentrate pressure placed on the one or more electrically connected switches.

Sensing devices according to embodiments of the invention may comprise one or more switches and the one or more pressure concentrators; the one or more pressure concentrators may, in turn, comprise a substantially planar surface of a greater surface area than the one or more switches; the one or more concentrators may also be in contact with the one or more switches to sense a pressure change upon the substantially planar surface and concentrate pressure upon the one or more switches.

Certain sensing devices may be contained within an infusion pump housing for securing and maintaining the sensing device therein. Suitable infusion pump housings include those described in U.S. patent application Ser. No. 16/034,301, the complete description of which is herein incorporated by reference.

Sensing devices according to embodiments of the invention may be enclosed within a sensing device housing in communication with a medical infusion line, wherein the sensing device may be in contact with the infusion line for detecting two or more pressure changes and may provide a compatible attachment for commercially available infusion pumps.

Sensing devices according to embodiments of the invention may be formed integrally within a pump head, wherein the pump head may comprise a pump head housing adapted to receive a medical infusion line. They may also comprise an attachment arrangement corresponding with any one of the many commercially available infusion pumps.

The support surface may be formed from any material providing the structural rigidity to support any componentry secured thereto. It may, further, be formed from or surface coated to provide a support surface compatible with a suitable mode of attachment for the securing means. For instance, the support surface must be amenable to physical attachment by a securing means employing, for example, a fastener or a bonding agent. Suitable securing means for securing the tubing to the support surface will be well known to persons skilled in the art and may be readily selected by such persons. Suitable structural materials or surface coatings for the selected securing means will be well known to persons skilled in the art.

In addition to surface coatings that are selected for providing a suitable supports surfaces for attaching a securing mean thereto, the support component may be surface coated to functionalise the surface. For instance, a surface coating may be applied to the support surface for electrically conductivity, for example it may be etched with electrically conductive material for transmitting an electrical signal from the one or more electrically connected switches.

Sensing devices according to embodiments of the invention may be attached to or mounted on a printed circuit board. The printed circuit board is preferably miniaturised, that is, it preferably comprises a layout that minimises the overall size of the printed circuit board. The printed circuit board may support the electrical connections formed between components of the sensing device and it may support one or more components thereon. One or more sensing device components are preferably attached to the printed circuit board.

In certain embodiments, the printed circuit board may comprise an aperture therethrough. The aperture may be a cut-out in the circuit board, shaped to fit the components of the sensing device. The printed circuit board may be formed from materials that prevent an overflow of charge within the sensing device.

Materials for manufacturing the componentry of the sensing device may be selected from those that meet regulatory requirements for medical infusion devices or requirements for disposal in accordance with environmentally sustainable practices. It is anticipated that suitable materials will be well known to a person skilled in the art.

Expandable tubing according to embodiments of the invention may be formed from a flexible material, such as silicon, rubber, plastic or composites thereof. The thickness or composition of the flexible material may be selected to allow the tubing to expand or contract upon a pressure change within the infusion line. In certain embodiments, the expandable tubing may be expandable at a portion of the tubing only, or it may comprise a localised area of weakening. This may assist in concentrating a change of pressure in line to a specific point in the expandable tubing which aligns with the position of the one or more electrically connected switches. As such, the expandable tubing may expand radially, or it may expand at a portion of the circumference of the expandable tubing so as to create a bulge upon the application of pressure within the length of expandable tubing.

Preferably, the infusion line is connected at one end to an infusion bag comprising the medicinal fluid and at the other end to a patient. The infusion line may be connected directly to the patient and/or the infusion bag, or it may be connected to the terminating ends of another line which is in turn connected to the patient and/or infusion bag.

Depending the material of the infusion line, its thickness, its lumen diameter, and the viscosity of the fluid passing therethrough, the infusion line may have a baseline pressure at which line pressure is neutral during the normal flow of fluid therethrough. That is, in circumstances where no irregular force is exerted outwardly, and no irregular vacuum is created internally. A deviation from the baseline pressure is preferably sensed by the sensing device.

The one or more pressure switches may be formed from flexible or tactile materials such as thin metal films, plastic sheet materials or other flexible materials that are flexible yet resistant to the application of pressure. The one or more pressure switches may be formed at least partially within the printed circuit board to become integral with the printed circuit board. The flexibility and resistance of materials may enable the one or more pressure switches to become depressed and released when an infusion line is occluded. The infusion line may be directly or indirectly in contact with the one or more pressure switches.

The one or more pressure switches according to embodiments may actuate at two or more pressure thresholds. In certain embodiments, a single pressure switch may actuate at two or more pressure thresholds, alternatively, two or more pressure switches may actuate at a single pressure threshold. In preferred embodiments, two or more pressure switches may comprise pressure switches actuating at one pressure threshold and pressure switches actuating at two or more pressure thresholds. Preferred embodiments comprise an upstream pressure switch actuating at one pressure threshold and one or more downstream switches actuating at two or more pressure thresholds. In particular, preferred embodiments comprise an upstream pressure switch actuating at one pressure threshold and two or more downstream switches actuating at two pressure thresholds.

Preferably, the one or more pressure switches may comprise one or more switches actuating at one or more pressure thresholds. Preferably, the one or more pressure switches actuate at one or more pressure thresholds. The one or more pressure switches may be a simple electronic switch or a flexible plastic shell-like switch or a dome switch that may be configured to actuate at a precise pressure within the infusion line.

Preferably, the one or more of the pressure switches may comprise two or more actuators. The two or more actuators enable a single switch to actuate at two or more pre-configured pressures arising from changes in pressure in the infusion line. The pressure threshold of the two or more actuators may be selected to indicate a partial occlusion and full occlusion. Each may signal the need for a different response, for instance a partial occlusion may pre-empt a full occlusion and may signal the need for occlusion avoidance intervention, whereas a full occlusion may signal the need to remove and replace or flush the line. Actuating at two or more pre-configured pressures may enable the quantification of pressure accumulating in the line.

Preferably, the one or more switches providing two or more actuators define a downstream occlusion sensor.

The one or more pressure sensors may be an upstream or downstream pressure sensor. Depending on the upstream or downstream occlusion, the pressure change in the infusion line may cause the infusion line to contract or expand. For instance, an upstream occlusion may cause a portion of the infusion line to contract. In response to a physical change in the infusion line, the upstream pressure sensor may release an actuator for detecting the pressure change in the infusion line. Preferably, the upstream pressure sensor may be electrically connected to an upstream electrical contact wherein the upstream electrical contact may be closed upon release of an upstream actuator thereby completing an electrical circuit across the upstream pressure sensor.

When a downstream occlusion occurs, the pressure in the infusion line may increase and cause an expansion in the infusion line. The expanded portion of the infusion line may exert a force on a downstream switch thereby depressing the switch to engage an actuator. Where a pressure switch comprises two or more actuators, a small increase in pressure in the infusion line may cause the downstream switch to partially depress a first actuator and a further increase in pressure may cause the downstream switch to depress the first and a second actuator. Additional actuators may be provided in a switch which may enhance the pressure sensitivity of the sensor.

Preferably, the downstream pressure sensor may be electrically connected to a downstream electrical contact when the downstream actuator is engaged, thereby completing an electrical circuit within the sensor. Preferably, the electrical contact is formed on the support surface of the support component.

Preferably, the sensing device may comprise one or more downstream sensors for sensing two or more pressures at two or more pressure thresholds.

Preferably, an upstream portion of the upstream pressure sensor is in direct contact with the infusion line and a portion of the downstream pressure sensor is in indirect contact with the infusion line.

In certain embodiments, one or more pressure concentrators may be located between the infusion line and the one or more downstream pressure sensors. The one or more pressure concentrators may be formed from a substantially rigid material. The pressure concentrator may be configured to collect and concentrate force and to channel it to the one or more downstream pressure sensors.

In certain embodiments, the pressure concentrator is external the outer surface of the expandable tubing. Preferably, the sensor array is external to the outer surface of the expandable tubing. Preferably, the one or more electrically connected switches is in physical contact with the exterior of the length of expandable tubing. Physical contact may be direct or indirect with a pressure concentrator located between an electrically connected switch and the expandable tubing.

The one or more pressure concentrators preferably comprises a pressure piece and a retaining portion. The pressure piece is preferably located between the pressure sensor and the expandable tubing. The retaining portion preferably retains the pressure piece in a desired location for collecting and concentrating force and for channelling it to the one or more downstream pressure sensors. The retaining portion may comprise a pressure piece connector connected to the pressure piece and a circuit board securement piece for securing the pressure concentrator to the circuit board.

Alternatively, a pressure piece may be affixed to a spiral or coil shaped retaining portion for holding the one or more pressure concentrators in place. Preferably, however, the pressure piece and the retaining portion may be formed as an integral piece.

Preferably, the pressure piece connector is a helical structure connected and a central terminating end to the pressure piece and at the outermost end to the circuit board securement piece, whereby the securement piece may be a plate that may be screwed, adhered or otherwise attached to the circuit board. In a preferred form, the pressure concentrator is an integral piece, preferably formed from a flexible yet rigid sheet, having a helical portion cut-out so as to form a central pressure piece, a helical pressure piece connector surrounding the pressure piece and a circuit board securement piece surrounding the helical pressure piece connector.

The pressure concentrator may thus be secured by placement of the pressure piece upon the switch and securing the circuit board securement piece to the circuit board beneath.

Preferred pressure concentrators may comprise two or more pressure pieces and/or two or more retaining pieces, wherein the pressure concentrator is in contact with two or more pressure sensors. A first pressure piece may have a smaller surface area than a second or further pressure piece to customise the sensitivity or pressure threshold of the two or more downstream pressure sensors. In such embodiments, a single type of downstream pressure sensor may be utilised whereby the pressure threshold that triggers each sensor is determined by the size, density, weight or surface area of the pressure piece.

In certain embodiments, the pressure concentrator may be configured such that the two or more pressure pieces are of different sizes and are disposed such that the pressure piece having a larger surface area is located in closer proximity to the pump head and/or the pressure piece having a smaller surface area is located further from the pump head. Such placement enables a pressure sensor array to sense an increasing pressure gradient, which may be indicative of a minor occlusion or pre-emptive of an imminent occlusion.

In certain embodiments, the concentrator blocks or concentrator block holders may be integral to or bonded to or fixed to the printed circuit board and may be manufactured unitarily or as multiple components.

In some embodiments, the sensing device may comprise a housing for securing or maintaining the one or more pressure sensors, the infusion line, the one or more pressure concentrators or the pump head. The shape of the housing may correspond to the shape of each component secured within the housing. The housing may be formed as an integral piece for securing the one or more pressure sensors, the infusion line, the pressure concentrator or the pumping assembly within the housing.

Alternatively, the housing may be formed as one or more pieces for individually securing the one or more pressure sensors, the infusion line, the intermediary concentrator or the pumping assembly. Preferably, the sensing device comprises a series of three housings wherein the first housing may be an upstream pressure sensor housing for securing the upstream pressure sensor therein, the second housing may be a pump head housing configured for securing a roller assembly and a pump motor of the pump head therein, and the third housing may be a downstream pressure sensor housing for securing the pressure concentrators and the downstream pressure sensors therein.

The housing may comprise one or more apertures for passing and securing the infusion line therethrough. The apertures may be formed such that a section of the length of expandable tubing may pass through and be in direct or indirect contact with the upstream or downstream pressure sensors. The length of expandable tubing may form a connection with an infusion line, which may, in turn, be wrapped around the roller assembly and positioned such that the movement of the roller assembly may squeeze the infusion line and pull the fluid from the infusion bag.

In an alternate embodiment, the one or more pressure sensors may be provided in a pump head comprising a roller assembly, a pump motor and one or more housings. The pumping assembly may be electrically connected to the circuit board. One or more pressure sensors may be embodied within the pump head. The pump head may further comprise one or more pressure concentrators.

Embodiments wherein the sensing device is disposed within a pump head may comprise three housing pieces wherein the first housing piece may secure a portion of the roller assembly of the pump head for preventing any contamination to the pump head, the second housing piece may secure the roller assembly, the section of the length of expandable tubing or the one or more pressure sensors and the third housing piece may be configured to secure the pump motor therein. The shape of the housing may correspond with the shape of the roller assembly or the pump motor for securing or maintaining the components therein.

The second housing piece may further comprise one or more apertures for allowing the section of the length of expandable tubing to enter and exit therethrough. The one or more pressure sensors may be provided in the second housing piece for sensing the baseline pressure change in the infusion line.

The one or more pressure sensors may be connected to an alarm for signalling the medical practitioner of the upstream or downstream occlusion. Alternatively, the one or more pressure sensors may be connected to a device having a display such as a computer, a keypad, a touchscreen, or a phone for displaying the detected pressure change in the infusion line.

The invention now will be described with reference to the accompanying drawings together with the Examples and the preferred embodiments disclosed in the detailed description. The invention may be embodied in many different forms and should not be construed as limited to the embodiments described herein. These embodiments are provided by way of illustration only such that this disclosure will be thorough, complete and will convey the full scope and breadth of the invention.

BRIEF DESCRIPTION OF THE FIGURES

FIG. 3 illustrates a disassembled sensing device according to embodiments of the invention; wherein FIG. 3a provides a perspective view of the upstream and the downstream switches of a sensing device, FIG. 3b provides a perspective view of the concentrator of the sensing device, according to the embodiments of the invention.

DETAILED DESCRIPTION

Several embodiments are described in detail below with reference to the Figures. Exemplary embodiments are described to illustrate certain aspects and embodiments of the invention, not to limit their scope, which is defined by the claims. Those of ordinary skill in the art will recognise that a number of equivalent variations of the various features provided in the description that follows may be possible.

Figure 1:
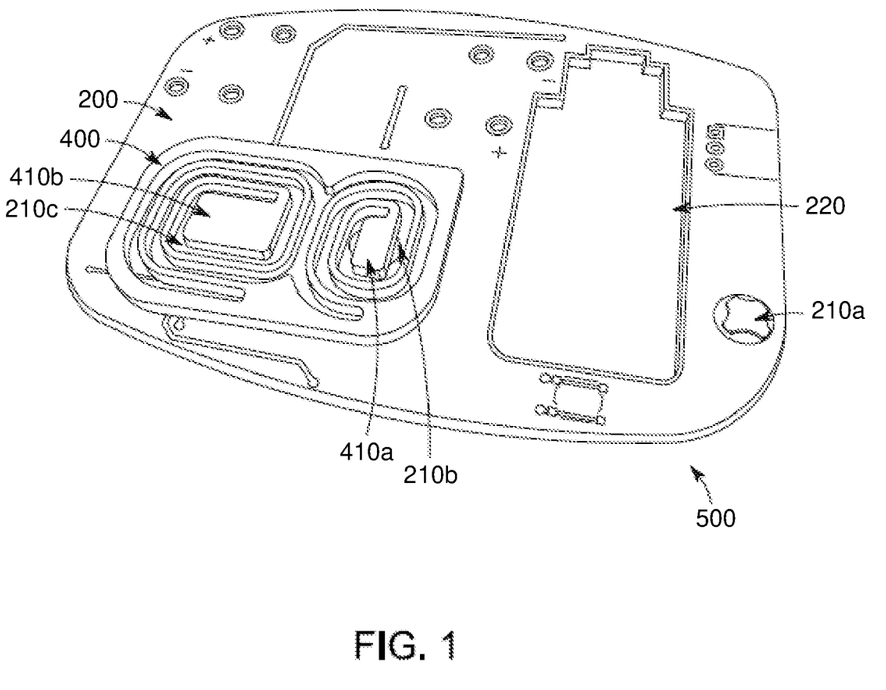
FIG. 1 illustrates a sensing device comprising a printed circuit board, a concentrator and three dome switches, according to embodiments of the invention.

FIG. 1 illustrates a preferred embodiment of sensing device 500 comprising a printed circuit board 200 and a concentrator 400. The printed circuit board 200 is configured to receive the components of the sensing device 500 thereon and provide an electrical connection therebetween. The printed circuit board 200 further comprises an upstream dome switch 210a, a near downstream dome switch 210b, and a far downstream dome switch 210c (not shown). A portion of the printed circuit board 200 includes a cut-out 220 shaped to receive a pump head 300 and pump head housing 240 therein (not shown). The cut-out 220 is provided between the upstream switch 210a and the downstream switches 210b, 210c.

The downstream switches 210b, 210c are provided for sensing downstream occlusions in a length of tubing provided by an infusion line 100 (not shown), and the upstream switch 210a is provided for sensing upstream occlusions in the infusion line 100. The infusion line 100 is maintained in contact with the upstream switch 210a and the downstream switches 210b and 210c, and terminates at either end with a connector for connecting with the patient's administration set at on end, and an additional length of infusion line at the other. The upstream switch 210a is depressed when the upstream occlusion sensor is nominal and is released in the event of a vacuum in the infusion line caused by an upstream occlusion.

The downstream switches 210b and 210c, however, are released when the downstream occlusion sensor is nominal, and are depressed in the event of a bulge in the infusion line 100, caused by a build-up of pressure in the line. The concentrator 400 is positioned above the downstream switches 210b, 210c to collect and concentrate force upon the downstream switches 210b or 210c from the bulging infusion lines, and thereby enhance the sensitivity of the downstream switches 210b or 210c for detecting small pressure increases in the line 100.

Figure 2:
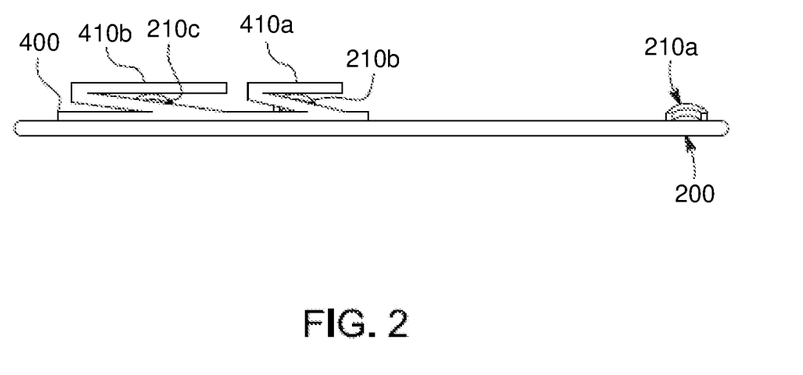
FIG. 2 provides a side view of a sensing device according to embodiments of the invention.

FIG. 2 illustrates a side view of the sensing device 500 wherein the upstream dome switches 210b and 210c are sandwiched between the concentrator 400 and the printed circuit board 110. While the upstream dome switch 210a makes direct contact with the infusion line 100 (not shown), the downstream dome switches 210b and 210c make contact with the concentrator 400, which in turn is in contact with the infusion line 100 (not shown).

Figure 3A:
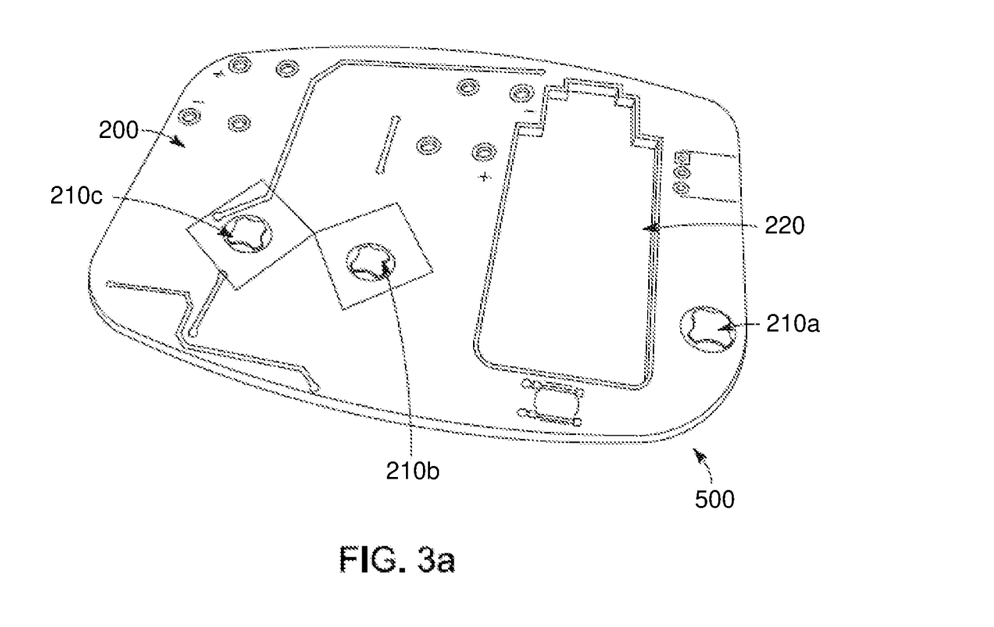

FIG. 3a provides a perspective view of the upstream switch 210a and the downstream switches 210b and 210c of the sensing device 500. The upstream switch 210a and the downstream switches 210b and 210c are formed from a flexible material typically used in the production of dome switches so that the upstream switch 210a and the downstream switches 210b, 210c can be released or depressed in response to a reduction or an increase in pressure in the infusion line 100, respectively.

The downstream switches 210b and 210c are mounted adjacent to the distal end of the cut-out 220 to detect downstream occlusions, and the upstream switch 120a is mounted adjacent to the proximal end of the cut-out 220 to detect an upstream occlusion. The switches 210a, 210b and 210c each have an actuator set to trigger at different pressures for sensing small pressure changes when a downstream or upstream occlusion occurs in the infusion line.

The upstream switch 210a has a single actuator and is simply triggered upon release of the switch at a single pre-determined pressure drop corresponding to the threshold pressure anticipated in the event of an upstream occlusion. The downstream switches 210b and 210c, however, are dual-pressure switches that can be partially depressed to trigger an actuator at a first pre-configured pressure or that can be completely depressed to trigger an actuator at a second pre-configured pressure, thereby detecting two pressure thresholds in the event of a downstream occlusion.

The array of downstream switches 210b and 210c, can therefore sense four pressure thresholds, which can be analysed to monitor a gradient change in pressure, for instance to ascertain whether an occlusion is increasing in severity and therefore presents a risk of fully occluding the line. Alternatively, different pressure thresholds may signal different events or interventions. For instance, in the event of a first pressure threshold being triggered by a first actuator and alarm may signal a nurse to monitor a patient for the following five minutes, whereas a fourth pressure threshold being triggered by a fourth actuator may signal a nurse or doctor to remove and flush the line immediately.

Actuators of downstream switches 210b and 210c, are identical switches and are triggered at the same pressure threshold. However, the pre-configured pressures at which first and second actuators of switches 210b and 210c are triggered, is altered by the concentrator 400 (not shown). The downstream switches 210a and 210b are in direct contact with the concentrator 400 which collects and concentrates pressure on the downstream dome switches 210a or 210b. Concentrator 400 comprises a small concentrator block 410a and a large concentrator block 410b, and a block holder 420. The relative sizes of concentrator blocks 410a and 410b determines the relative difference in the pre-configured pressures of 210b and 210c. For instance, when the size of 410b is twice that of 410a, the first and second actuators of switch 210c is triggered at a pressure threshold twice that of first and second actuators of switch 210b.

Figure 3B:
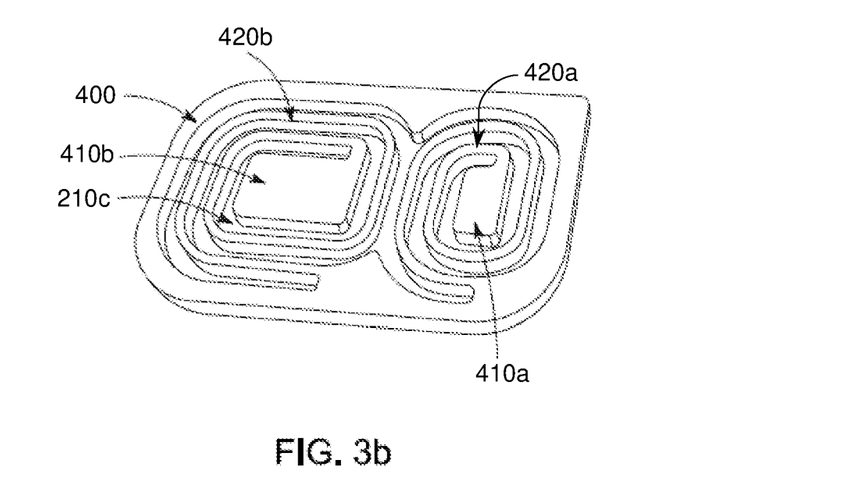

FIG. 3b provides a perspective view of the concentrator 400 of the sensing device 500. The concentrator 400 is formed as an integral piece comprising the two blocks 410a and 410b and a block holder 420 further comprising a small block holder 420a and a large block holder 420b; wherein the blocks 410a and 410b are positioned so that each of their lower surfaces is in direct contact with downstream switches 210b and 210c, respectively. Blocks 410a and 410b each collect force from their upper surface and concentrate that force upon each of the respective switches beneath. Switches 210b and 210c provided beneath concentrator blocks 410a and 410b are more sensitive to pressure increases within the infusion line, and therefore provide a more accurate detection of pressure changes within the infusion line 100.

The pressure sensitivity of a downstream switch can be adjusted either by altering the pressure threshold of the actuator or by altering the surface area of the block with which it comes in contact. Downstream pressure switches 210b and 210c are the same type of dome switch, however, blocks 410a and 410b have different surface areas to vary the effective pressure threshold of the actuator of each switch. Block 410a has a larger surface area than block 410b, for sensing lower pressure threshold in the infusion line 100, and block 410b has a smaller surface area for sensing higher pressure thresholds.

In preferred embodiments of concentrator 400, blocks 410a and 410b are each maintained in place by block holders 420a and 420b. Block holders 420a and 420b are spiral shaped cut-outs joined at one end to blocks 410a and 410b, respectively, and at the other end to concentrator 400 which is in turn secured to printed circuit board 200 to secure each of the blocks in place. The concentrator 400 and block holders 420a and 420b are arranged to evenly depress downstream switches 210b and 210c to their partial or complete point of depression without sliding or moving away from switches 210b and 210c.

Figure 4:
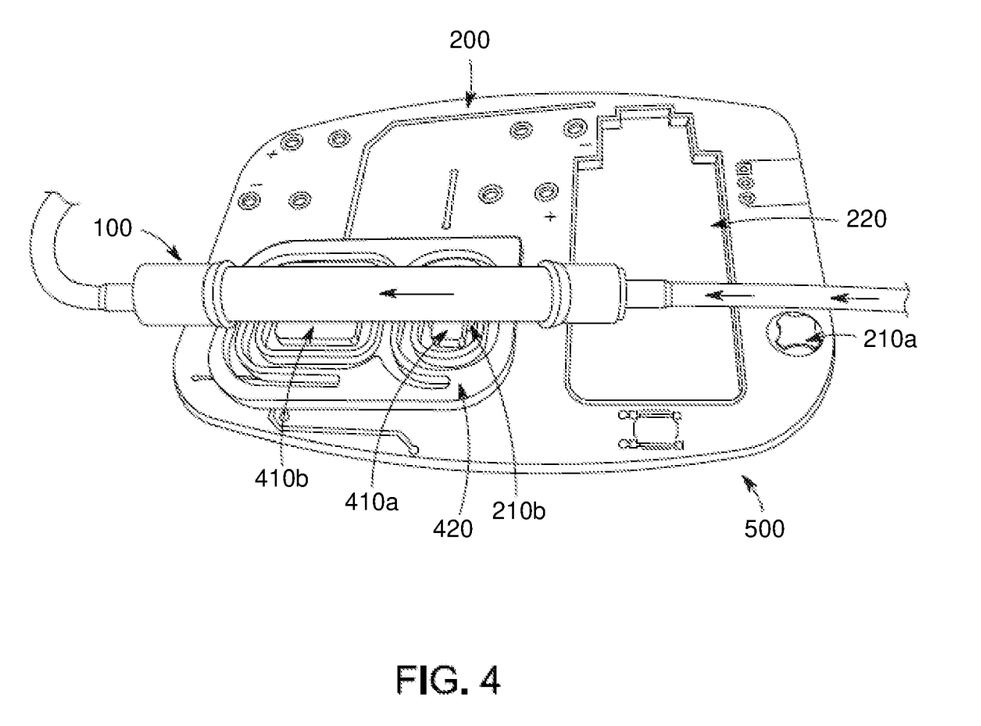
FIG. 4 provides a sensing device comprising an infusion line, according to embodiments of the invention.

FIG. 4 shows the sensing device 500 comprising an infusion line 100. The line 100 is positioned such that the first end of the line 100 is connected to an infusion bag comprising medicinal fluid and the second end of the line 100 is connected to a patient to allow the fluid to flow from the infusion bag to the patient. The line 100 is positioned to make and maintain contact with the upstream switch 210a and blocks 410a, 410b of sensing device 500.

In the operation of sensing device 500, the pump being monitored is set to operate at a known flow rate. The baseline pressure of infusion line 100 at the given flow rate for the physical parameters of the fluid being administered (e.g. viscosity) is set as a baseline pressure. Any occlusion in the infusion line 100 will cause a change to the baseline pressure of the infusion line 100. An upstream occlusion causes a decrease in the baseline pressure as the infusion line 100 shrinks or contracts. As the infusion line 100 is in direct contact with the upstream switch 210a, a contraction in the infusion line 100 causes the upstream switch 210a to release and register a negative pressure change, thereby signalling an upstream occlusion.

A downstream occlusion in the infusion line 100 will cause an increase in the baseline pressure as it causes the infusion line 100 to expand or bulge. As the infusion line 100 expands, it exerts a force on the block 410a which is collected across the surface area of the block and concentrated on the downstream switch 210b thereby depressing the switch 210b to trigger one or two of its actuators, thereby signalling a downstream occlusion or pre-empting a downstream occlusion in line 100. If only pressure switch 210b is triggered, a further increase in the baseline pressure will cause the block 410b and switch 210c to become depressed and trigger one or two of switch 210c's actuators.

As described above, sensing device 500 may detect four pressure thresholds in line 100 by triggering any one of four different actuators. Relative to one another, these four pressure thresholds can effectively provide quantitative measurements of pressure relative to baseline pressure, further, the quantitative changes in pressure can be sensed over time. This sensing may pre-emptively indicate the likelihood of occlusion or the severity of the impact of the occlusion on the patient.

Figure 5:
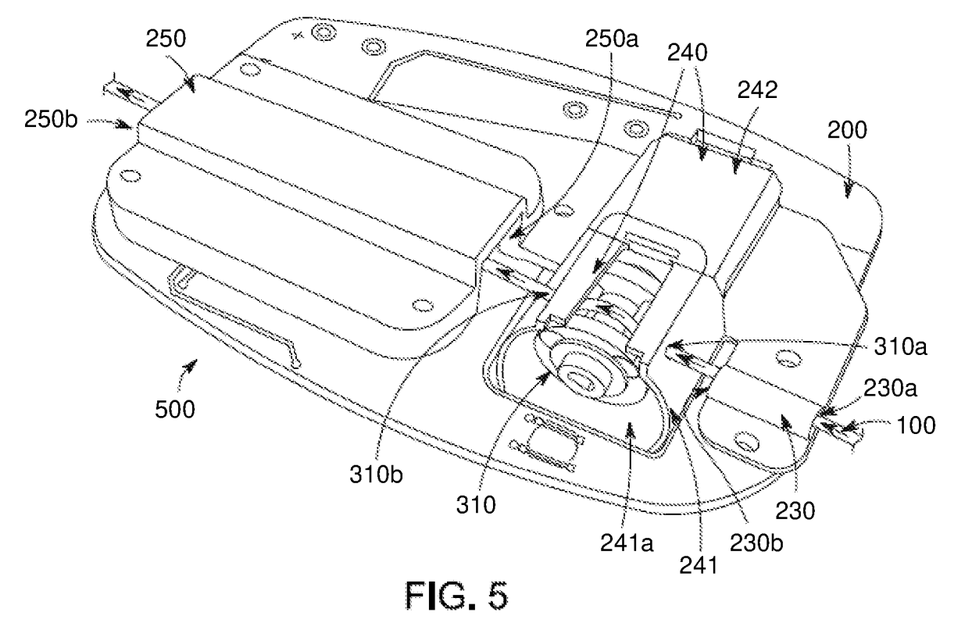
FIG. 5 provides an upstream housing, a pump head housing and a concentrator housing of a sensing device, according to embodiments of the invention.

FIG. 5 shows several housing components that maintain the infusion line 100 in position for upstream and downstream occlusion sensing. The upstream housing 230 is shaped to receive the infusion line 100 and is secured to the printed circuit board 200 upstream of the pump to maintain the line 100 in position upon the upstream pressure switch 210a (not shown). A pump head housing 240 and a concentrator housing 250 are shaped to receive the infusion line 100 and are secured to the printed circuit board 200 to maintain the line 100 in position within the pump head and in position upon the downstream pressure switches 210b and 210c (not shown) downstream of the pump. The concentrator housing 250 is configured to secure concentrator blocks 410a, 410b and a block holder 420a beneath the housing and upon the downstream pressure switches 210b and 210c.

In certain embodiments the housing pieces 230, 240 and 250 may be replaced with an alternative means of securing infusion line 100 including but not limited to mounting plates, brackets, supports, and adhesives, which may be external to or integrated with the printed circuit board or external housing. The pieces may be formed individually or as a single piece to replace any combination or all of housing pieces 230, 240 and 250.

The upstream housing 230 comprises an inlet aperture 230a and an outlet aperture 230b positioned at opposing ends of the housing. The inlet aperture 230a is configured to allow the line 100 to be placed in a desired position within the sensing device 500. The line 100 can be threaded through the first aperture 230a and pass over the upstream switch 210a and then exit through the outlet aperture 230b.

The pump head housing 240 fits within the cut-out 220 of the circuit board 200. The pump head housing 240 comprises a roller assembly holder 241 shaped to receive and secure a roller assembly 310 therein. The roller assembly holder 241 comprises an opening 241a to receive the roller assembly 310 therein and a cutaway portion comprising ridges which secure the roller assembly 310 therein. The roller assembly 310 of the pump head 300 squeezes the line containing medicinal fluid to draw it from the infusion bag, pinch off the captured fluid and deliver it through the discharge end of the line 100.

The roller assembly holder 241 is affixed to a motor holder 242 for securing a pump motor 320 of the pump head 300 therein. The motor holder 242 is formed such that the bottom surface of the motor holder 242 is also the top surface of the roller assembly holder 241. A hole is formed through the bottom portion of the motor holder 242 to allow the shaft to pass through the aperture connecting the motor and the roller assembly 310 of the pump head therein.

The roller assembly holder 310 further comprises an inlet aperture 310a and an outlet aperture 310b wherein the inlet aperture 310a is configured to receive the infusion line 100 which is then run through the roller assembly 310. The line 100 is run around the roller assembly 310 where it is squeezed to draw the medicinal fluid from the infusion bag and pinched off to deliver the fluid to the patient. The line 100 finally passes through the outlet aperture 310b.

The concentrator housing 250 is configured to secure the blocks 410a and 410b, the block holder 420a of the concentrator 400, the downstream switches 210b, 210c and the infusion line 100 therein. The concentrator housing 250 comprises an inlet 250a and an outlet aperture 250b wherein the inlet aperture 250a is configured to receive the infusion line 100 exiting from the roller assembly outlet aperture 310b. Once the line 100 enters the inlet aperture 250a, it is passed over the concentrator 400 such that the line 100 comes in direct contact with the blocks 410a and 410b. The line 100 is then allowed to exit through the outlet aperture 250b. The outlet aperture 250b is the discharge end of the line 100 which is connected to a patient.

An infusion bag containing a medicinal fluid is connected to one end of line 100. The other end of line 100 is passed through the inlet aperture 230a of the upstream switch housing 230 and placed in contact with the upstream switch 210a. It passes through the upstream switch housing outlet aperture 230b and enters the roller assembly 310 through the roller assembly inlet aperture 310a. The line 100 is wrapped around the roller assembly 310 so the movement of the rollers can draw the medicinal fluid through the line 100. The line 100 then passes through the roller assembly outlet aperture 310b and is placed within the concentrator housing 250 through the concentrator housing inlet aperture 250a. The line 100 is positioned upon blocks 410a and 410b and passes through the concentrator housing outlet aperture 250b where the other end of the line is connected to the patient.

When the pump is in operation, the pump motor 320 rotates the roller assembly 310 at a known speed. The rotation of the roller assembly 310 squeezes the line 100 thereby creating a pressure difference in the line 100 to draw and move the medicinal fluid from the infusion bag to the patient.

If the line 100 running between the pump head 300 and the fluid container is occluded, the operation of the pump causes a vacuum within the line, made apparent by a drop in the baseline pressure within the line 100. The pressure change causes the line 100 to contract releasing the upstream switch 210a. When the upstream switch 210a is released, it signals an upstream occlusion in line 100.

If the line 100 running between the pump head 300 and the patient is occluded, the baseline pressure within line 100 increases causing expansion or a bulge in line 100. The expanded portion of the line 100 exerts pressure on block 410a which is concentrated upon downstream switch 210b to depress downstream switch 210b to its first actuator. A further increase in the baseline pressure will cause the downstream switch 210b to be depressed further still to its second actuator. If the baseline pressure increases even further, expansion in line 100 increases further causing block 410b to exert pressure upon downstream switch 210c to its first actuator. A further increase in the baseline pressure will cause downstream switch 210c to be depressed to its second actuator, thereby signalling a further change in the downstream occlusion.

Once the switch 210b or 210c is depressed to its first or second actuator, it creates an electrical contact with the circuit board 200 for closing an electrical circuit. A signal is then sent via an audible alarm indicating a possible occlusion in line 100.

Figure 6:
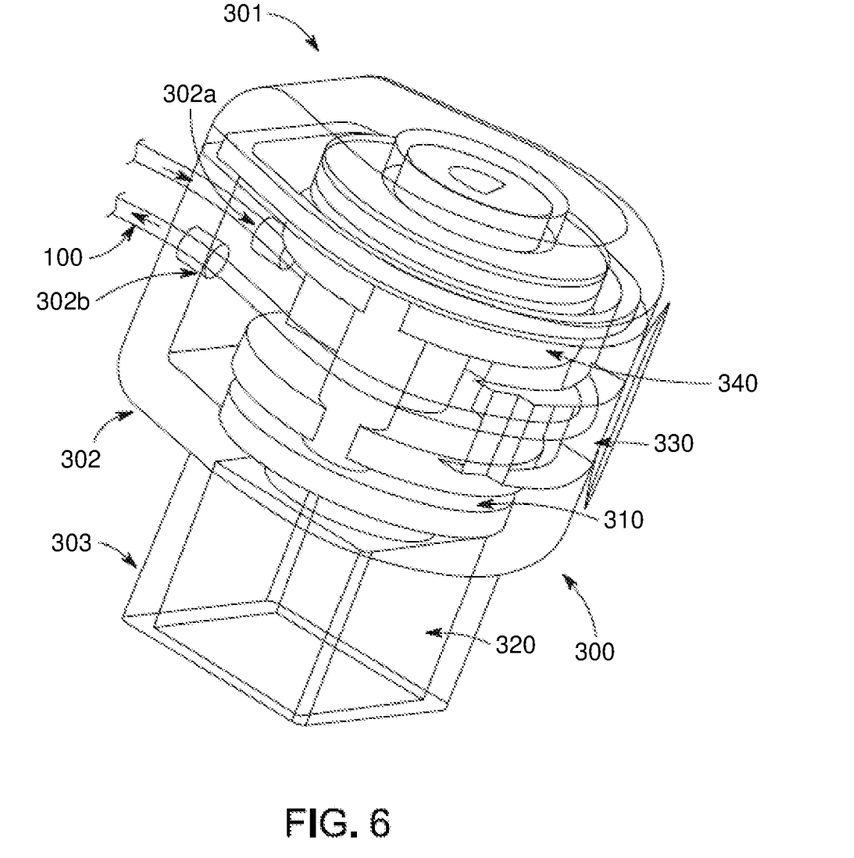
FIG. 6 provides a pump head comprising a roller assembly, a motor (not shown) and a top, middle and bottom housing of the pump head, according to embodiments of the invention.

FIG. 6 shows pump head 300 comprising a roller assembly 310, a motor 320 (not shown) and a top 301, middle 302 and bottom housing 303. The roller assembly 310 further comprises three rollers 340 that are rotated to move the medicinal fluid from one end of the infusion line 100 to the other. The rotation of the rollers is controlled by motor 320, the three rollers and the motor 320 are connected via a shaft. Both the roller assembly 310 and the motor 320 are enclosed within a pump head housing.

The pump head housing is provided as three separate pieces wherein the first piece forms the top housing 301 providing a cover for the top portion of the roller assembly 310. The top housing 301 is shaped to fit to the middle housing 302.

The second piece forms the middle housing 302 for maintaining and securing the roller assembly 310 therein. The middle housing 302 comprises two apertures, an aperture-in 302a and an aperture-out 302b wherein the aperture-in 302a is shaped to receive a line 100 into the roller assembly 310 and the aperture-out 302b is shaped to allow the line to exit therethrough.

A dome switch 330 is provided at the inside of the middle housing 302 for sensing an occlusion in the line 100. The dome switch 330 functions as a tactile sensor having two actuators wherein each actuator is set at different pressure values for detecting different pressure thresholds in the line 100. When the line enters the middle housing aperture-in 302a, it is positioned around the roller assembly 310 such that it comes in direct contact with the dome switch 330. A circuit board 305 is provided at the outside of the middle housing for providing an electrical connection to the pump head.

A third piece forming the bottom housing 303 is provided for securing a motor 320 therein. The bottom housing 303 is affixed to the bottom surface of the middle housing 302. The top surface of the bottom housing 303 comprises an aperture for receiving the shaft from the middle housing 302 and maintaining it therein. The motor 320 is further connected to the shaft that allows the roller assembly 310 to rotate when in operation.

When in operation, the motor in the bottom housing 303 rotates the roller assembly 310 of the middle housing 302. Each roller squeezes the line 100 to draw and move the medicinal fluid from the container. The medicinal fluid is then allowed to pass through the line 100 to the patient. If an occlusion occurs, a change to the baseline pressure causes the line 100 to contract or expand signalling an occlusion event, as described in the above embodiments of the invention.

Once the pump pressure switch 330 is triggered, it creates an electrical contact with the circuit board 305 for closing an electrical circuit. A signal is then sent as an audible alarm indicating a possible occlusion in the line 100.

It will be understood that the use of the term "switch", or pluralisations or variations thereof such as "switches" or derivative terms such as "pressure switch" as used herein will be understood to include any component which creates or breaks one or more electrical circuit connections.

In particular, it will be understood that the use of the term "pressure switch" or pluralisation or derivatives thereof include any switch in which the actuation criteria of the switch includes the increasing or decreasing of pressure thereon past one or more pressure thresholds.

It will be understood that the use of the term "actuation threshold", or pluralisations or variations thereof such as "actuation thresholds" or derivative terms, as used herein in reference to pressure switches, will be understood to refer to a physical characteristic of the pressure switch defining the applied pressure at which the switch actuates. This physical characteristic is determined by the construction of the pressure switch, for example, the combination of the pressure switch's material composition, physical shape, thickness or density of materials and the like.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

It is appreciated the specific connection or attachment mechanisms or methodologies used to connect two particular components of the sensing device, as described herein, may be utilised to connect other components of the sensing device, as may be desired.

The various components described herein may be made from any of a variety of materials including, for example, plastic, plastic resin such as polyethylene, polypropylene, nylon, composite material, or rubber, for example, or any other material as may be desired. For example, the sensing device of this disclosure may be produced from a plastic resin, such as polyethylene, and by injection molding. However, it is appreciated that safe material consideration should be considered in the case that the sensing device of this disclosure is used with a medical device. The sensing device of the invention can be used with any other closed fluid systems for detecting any restrictions in the flow of fluids.

A variety of production techniques may be used to make the apparatuses and components described herein. For example, suitable injection molding and other molding techniques and other manufacturing techniques might be utilised. Also, the various components of the apparatuses may be integrally formed, as may be desired, in particular when using molding construction techniques. Also, the various components of the apparatuses may be formed in pieces and connected together in some manner, such as with suitable adhesive.

The various apparatuses and components of the apparatuses, as described herein, may be provided in various sizes and/or dimensions, as desired. Suitable sizes and/or dimensions will vary depending on the specifications of connecting components or the field of use, which may be selected by persons skilled in the art.

It will be appreciated that features, elements and/or characteristics described with respect to one embodiment of the disclosure may be used with other embodiments of the invention, as desired. It will also be appreciated that the effects of the present disclosure are not limited to the above-mentioned effects, and other effects, which are not mentioned herein, will be apparent to those in the art from the disclosure and accompanying claims.

Although the preferred embodiments of the present disclosure have been disclosed for illustrative purposes, those skilled in the art will appreciate that various modifications, additions and substitutions are possible, without departing from the scope and spirit of the disclosure and accompanying claims.

It will be understood that when an element or layer is referred to as being "on", "in contact with", "in physical contact with" or "within" another element or layer, the element or layer can be directly on or within another element or layer or intervening elements or layers. In contrast, when an element is referred to as being "directly on", "directly in contact with", "directly in physical contact with" or "directly within" another element or layer, there are no intervening elements or layers present.

As used herein, the term "and/or" includes any and all combinations of one or more of the associated listed items.

It will be understood that, although the terms first, second, third, etcetera, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present disclosure.

Spatially relative terms, such as "lower", "upper", "top", "bottom", "left", "right" and the like, may be used herein for ease of description to describe the relationship of one element or feature to another element(s) or feature(s) as illustrated in the figures. Spatially relative terms, such as those provided above, may be used herein to define the relationship of one feature with respect to the spatial definition of another feature. It will be understood that spatially relative terms are intended to encompass different orientations of structures in use or operation, in addition to the orientation depicted in the drawing figures. For example, if a device in the drawing figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein should be interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the description are described herein with reference to diagrams and/or cross-section illustrations, for example, that are schematic illustrations of preferred embodiments (and intermediate structures) of the description. As such, variations from the shapes of the illustrations as a result, for example, of manufacturing techniques and/or tolerances, are to be expected. Thus, embodiments of the description should not be construed as limited to the particular shapes of components illustrated herein but are to include deviations in shapes that result, for example, from manufacturing.

Unless otherwise defined, all terms (including technical and scientific terms) used herein have the same meaning as commonly understood by one of ordinary skill in the art to which this description belongs. It will be further understood that terms, such as those defined in commonly used dictionaries, should be interpreted as having a meaning that is consistent with their meaning in the context of the relevant art and will not be interpreted in an idealised or overly formal sense unless expressly so defined herein.

Any reference in this specification to "one embodiment," "an embodiment," "example embodiment," etc., means that a particular feature, structure, or characteristic described in connection with the embodiment is included in at least one embodiment of the description. The appearances of such phrases in various places in the specification are not necessarily all referring to the same embodiment. Further, when a particular feature, structure, or characteristic is described in connection with any embodiment, it is within the purview of one skilled in the art to effect and/or use such feature, structure, or characteristic in connection with other ones of the embodiments.

Embodiments are also intended to include or otherwise cover methods of using and methods of manufacturing any or all of the elements disclosed above.

While the invention has been described above in terms of specific embodiments, it is to be understood that the invention is not limited to these disclosed embodiments. Upon reading the teachings of this disclosure many modifications and other embodiments of the invention will come to the mind of those skilled in the art to which this invention pertains, and which are intended to be and are covered by both this disclosure and the appended claims.

All publications mentioned in this specification are herein incorporated by reference. Any discussion of documents, acts, materials, devices, articles or the like which has been included in the present specification is solely for the purpose of providing a context for the present invention. It is not to be taken as an admission that any or all of these matters form part of the prior art baseline or were common general knowledge in the field relevant to the present invention as it existed in Australia or elsewhere before the priority date of each claim of this application.

It is indeed intended that the scope of the invention should be determined by proper interpretation and construction of the appended claims and their legal equivalents, as understood by those skilled in the art relying upon the disclosure in this specification and the attached drawings.

The invention claimed is:

1. A sensing device for a one-time use medical device comprising:
   a support component having a support surface for mounting thereon one or more electrically connected switches configured to actuate at a first pre-configured pressure and at a second pre-configured pressure, the one or more electrically connected switches comprising a first pressure switch, wherein the one or more electrically connected switches forms a sensor array adapted to sense expansion or contraction of the expandable tubing,
   a length of expandable tubing for passing a fluid therethrough secured to the support surface by a securing means, and
   a pressure concentrator positioned between the first pressure switch and a portion of the length of expandable tubing, the pressure concentrator having an upper surface in physical contact with the portion of the length of expandable tubing, and a lower surface in physical contact with the first pressure switch, the pressure concentrator being shaped to concentrate pressure from expansion or contraction of the expandable tubing to the first pressure switch, wherein the concentrator is configured to modulate the pressure actuation threshold of the first pressure switch to the first pre-configured pressure.

2. The sensing device of claim 1 wherein the one or more electrically connected switches comprise one or more pressure switches having two or more pressure actuation thresholds configured to actuate at a first pre-configured pressure and at a second pre-configured pressure, and the first and second pre-configured pressures of the sensor array being capable of providing a stepped output at the two or more pressure actuation thresholds upon expansion or contraction of the expandable tubing.

3. The sensing device of claim 1, wherein the first pressure switch has two or more pressure actuation thresholds configured to actuate at a first pre-configured pressure and at a second pre-configured pressure.

4. The sensing device of claim 1, comprising:
   a pressure concentrator holder configured to maintain the placement of the pressure concentrator in contact with the first pressure switch or the portion of the length of expandable tubing and wherein:
   the support component comprises a printed circuit board,
   the support surface is provided by a surface of the printed circuit board, and
   the pressure concentrator holder is formed integrally with the printed circuit board.

5. The sensing device of claim 1, comprising a second pressure switch having one or more pressure actuation thresholds, wherein the first pressure switch has two or more pressure actuation thresholds and the second pressure switch has one or more pressure actuation thresholds and is configured to actuate at a third pre-configured pressure.

6. The sensing device of claim 1, comprising at least one additional electrically connected switch having a pressure deactuation threshold, and which is configured to deactuate at an additional pre-configured pressure upon contraction of the expandable tubing.

7. A sensing device for a one-time use medical device comprising;
   a support component having a support surface for mounting thereon one or more electrically connected switches configured to actuate at a first pre-configured pressure and at a second pre-configured pressure,
   a length of expandable tubing for passing a fluid therethrough, secured to the support surface by a securing means,
   the one or more electrically connected switches comprising a first pressure switch, wherein the one or more electrically connected switches forms a sensor array adapted to sense expansion of the expandable tubing, and
   at least one additional electrically connected switch having a pressure deactuation threshold, which is configured to deactuate at an additional pre-configured pressure upon contraction of the expandable tubing, the at least one additional electrically connected switch comprising a first additional pressure switch and a pressure concentrator positioned between the first additional pressure switch and a portion of the length of expandable tubing, the pressure concentrator having an upper surface in physical contact with the portion of the length of expandable tubing and a lower surface in physical contact with the first additional pressure switch, the pressure concentrator being shaped to concentrate pressure from contraction of the expandable tubing to the first additional pressure switch,
   wherein the concentrator is configured to modulate the pressure actuation threshold of the first additional pressure switch to the additional pre-configured pressure.

8. The sensing device of claim 7, wherein the securing means comprises a tube housing defining a cavity for placing at least a section of the length of expandable tubing therein, and a fastener or bonding agent for securing the tube housing to the support surface to maintain the placement of a portion of the length of expandable tubing in contact with the one or more electrically connected switches.

9. The sensing device of claim 8, wherein the tube housing comprises:
a wall having an external surface and an internal surface, the wall extending longitudinally wherein the internal surface of the wall defines a longitudinal cavity for placing at least a section of the length of expandable tubing lengthwise therein, the wall terminating at opposing ends of the longitudinal cavity in an opening configured to allow the expandable tubing to pass therethrough, the wall having at least one protrusion along the length of two opposing lengthwise edges of the wall, wherein a portion of the internal surface of the wall at the protrusions is in contact with the support surface and is secured thereto.

10. A method for detecting a pressure change within a medical infusion line of a one-time use medical device, the method comprising:
obtaining a sensing device according to claim 1 or 7,
connecting the medical infusion line with the length of expandable tubing,
passing a fluid through the medical infusion line and the length of expandable tubing,
changing the pressure of the fluid within the medical infusion line,
expanding or contracting the expandable tubing,
applying pressure to an electrically connected switch by the expandable tubing,
applying sufficient pressure to reach a pressure actuation or a deactuation threshold,
actuating or deactuating at a pre-configured pressure,
outputting actuation or deactuation at the pressure actuation or deactuation threshold, and
pre-empting an occlusion in the medical infusion line.

11. A method of manufacturing a sensing device according to claim 1, the method comprising:
obtaining:
a support component having one or more electrically connected switches mounted thereon,
a length of expandable tubing, and
a securing means,
maintaining the length of expandable tubing in physical contact with the one or more electrically connected switches, and
securing the length of expandable tubing to the support component by securing the securing means to the support surface.

* * * * *